US012785668B2

(12) United States Patent
Chen et al.

(10) Patent No.: US 12,785,668 B2
(45) Date of Patent: Nov. 3, 2026

(54) PULSE GENERATION CIRCUITRY

(71) Applicant: XILINX, INC., San Jose, CA (US)

(72) Inventors: Li-Yang Chen, San Jose, CA (US); Chuen-Huei Chou, San Jose, CA (US); Chi Fung Poon, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 288 days.

(21) Appl. No.: 18/612,958

(22) Filed: Mar. 21, 2024

(65) Prior Publication Data

US 2025/0300639 A1 Sep. 25, 2025

(51) Int. Cl.
*H03K 3/356* (2006.01)
*H03K 5/00* (2006.01)
*H03K 5/01* (2006.01)
*H04J 3/06* (2006.01)

(52) U.S. Cl.
CPC ......... *H03K 3/356104* (2013.01); *H03K 5/01* (2013.01); *H04J 3/0617* (2013.01); *H03K 2005/00286* (2013.01)

(58) Field of Classification Search
CPC ... H04J 3/0617; H03K 3/356104; H03K 5/01; H03K 2005/00286; H03M 9/00
See application file for complete search history.

(56) References Cited

U.S. PATENT DOCUMENTS 7,649,957 B2 * 1/2010 Garrity ................ H03K 5/1515 326/97
8,169,243 B2 * 5/2012 Quan ................... H03K 5/1565 327/158
8,564,346 B2 * 10/2013 Quan ................... H03K 5/1565 327/158
8,669,784 B1 * 3/2014 Wu .......................... H03K 5/05 327/299
8,717,081 B2 * 5/2014 Allott ................. H03K 5/15093 327/299
8,736,309 B2 * 5/2014 Garrity ..................... G06F 1/06 375/280
9,124,278 B1 * 9/2015 Das ........................ G11C 27/02
9,191,127 B2 * 11/2015 Koli ....................... H04B 15/00
(Continued)

FOREIGN PATENT DOCUMENTS

CN 117639739 B * 5/2024 ............... H03K 5/19
CN 121312073 A * 1/2026 ............. H03K 21/02
(Continued)

*Primary Examiner* — Eric Nowlin
(74) *Attorney, Agent, or Firm* — Patterson + Sheridan, LLP

(57) ABSTRACT

Examples herein describe pulse generation circuitry. The pulse generation circuitry includes a first pulse generator circuit configured to generate a first pulsed output by sampling a data input using a first clock signal having first pulses and a second clock signal having second pulses that do not overlap the first pulses. The first and second clock signals are separated by a phase shift. The pulse generation circuitry also includes a second pulse generator circuit configured to generate a second pulsed output by sampling the data input using a third clock signal having third pulses and a fourth clock signal having fourth pulses that do not overlap the third pulses. The third and fourth clock signals are separated by the phase shift. A multiplexor is configured to output a third pulsed output based on the first pulsed output and the second pulsed output.

20 Claims, 4 Drawing Sheets

(56) References Cited

U.S. PATENT DOCUMENTS

| | | | | |
|---|---|---|---|---|
| 9,306,548 | B1 * | 4/2016 | Wiktor | H03K 7/08 |
| 9,742,386 | B2 * | 8/2017 | Jin | H03K 5/1504 |
| 9,979,394 | B2 * | 5/2018 | Ye | H03K 3/0375 |
| 10,389,335 | B1 * | 8/2019 | Schicht | H03K 3/017 |
| 10,998,964 | B2 * | 5/2021 | Buer | H04B 7/18513 |
| 11,073,413 | B2 * | 7/2021 | Thor | G01D 5/24476 |
| 11,323,102 | B2 * | 5/2022 | Kalcher | H03K 5/00006 |
| 11,371,864 | B2 * | 6/2022 | Thor | H03K 5/13 |
| 11,448,564 | B2 * | 9/2022 | Maccioni | G01L 1/148 |
| 11,604,223 | B1 * | 3/2023 | Mangal | G01R 31/318536 |
| 11,616,503 | B2 * | 3/2023 | Thor | H03K 5/13 250/208.2 |
| 11,625,355 | B2 * | 4/2023 | Khamesra | H02M 3/1563 713/401 |
| 11,831,320 | B2 * | 11/2023 | Thor | G01D 5/24476 |
| 2004/0119518 | A1 * | 6/2004 | Jaussi | H04L 25/028 327/202 |
| 2006/0071698 | A1 * | 4/2006 | Parikh | H03K 5/131 327/231 |
| 2010/0123609 | A1 * | 5/2010 | Yu | H03M 9/00 341/101 |
| 2010/0253405 | A1 * | 10/2010 | Quan | H03K 5/1515 327/158 |
| 2012/0161837 | A1 * | 6/2012 | Quan | H03K 5/1565 327/158 |
| 2012/0256670 | A1 * | 10/2012 | Ding | H03K 3/017 327/175 |
| 2013/0328605 | A1 * | 12/2013 | Allott | H03K 5/15093 327/295 |
| 2015/0016492 | A1 * | 1/2015 | Koli | H04B 1/40 375/219 |
| 2015/0229298 | A1 * | 8/2015 | Tomita | H03K 3/012 327/143 |
| 2016/0036441 | A1 * | 2/2016 | Dey | H03K 19/018521 326/63 |
| 2017/0170814 | A1 * | 6/2017 | Jin | H03K 5/15 |
| 2019/0372559 | A1 * | 12/2019 | Schicht | H03K 5/156 |
| 2020/0021357 | A1 * | 1/2020 | Buer | H04B 7/18513 |
| 2020/0166383 | A1 * | 5/2020 | Thor | H03K 5/24 |
| 2021/0190615 | A1 * | 6/2021 | Maccioni | H03M 3/34 |
| 2021/0281253 | A1 * | 9/2021 | Kalcher | H03K 5/00006 |
| 2021/0318146 | A1 * | 10/2021 | Thor | G01D 5/34715 |
| 2022/0066980 | A1 * | 3/2022 | Khamesra | H02M 3/1552 |
| 2022/0276075 | A1 * | 9/2022 | Thor | G01D 5/24476 |
| 2023/0208412 | A1 * | 6/2023 | Thor | H03K 5/24 250/208.2 |
| 2024/0413962 | A1 * | 12/2024 | Park | H03K 23/542 |
| 2025/0202468 | A1 * | 6/2025 | Boujamaa | H03K 5/135 |

FOREIGN PATENT DOCUMENTS

| | | | | | |
|---|---|---|---|---|---|
| EP | 2611031 | A1 | * | 7/2013 | H03H 19/008 |
| JP | 2015133560 | A | * | 7/2015 | |
| KR | 20090020410 | A | * | 2/2009 | H03K 5/1515 |
| TW | 202502001 | A | * | 1/2025 | H03K 21/02 |
| WO | WO-2013098182 | A1 | * | 7/2013 | H04W 84/12 |
| WO | WO-2022051180 | A1 | * | 3/2022 | H02M 3/1566 |
| WO | WO-2024258524 | A1 | * | 12/2024 | H03K 21/02 |

* cited by examiner

PULSE GENERATION CIRCUITRY

TECHNICAL FIELD

Examples of the present disclosure generally relate to data serialization for transmission, and more specifically, to pulse generation circuitry.

BACKGROUND

In high-speed transmitter applications (e.g., 100+ Gbps), it is beneficial to control transmitter components utilizing an internal clock with a frequency that is a fraction (e.g., a quarter of the rate) of the frequency of the system clock. For instance, using the internal clock with the lower frequency to control the transmitter components can improve signal integrity, reduce power consumption, mitigate electromagnetic interference, etc. However, as data transmission rates and corresponding system clock frequencies continue to increase, the internal clock frequencies also increase. At high enough internal clock frequencies, techniques to alleviate the bandwidth are needed such as use of passive inductors that occupy a large area/footprint and can introduce mutual coupling which degrades signal integrity and increases power consumption.

SUMMARY

Pulse generation circuitry is described in some embodiments. The pulse generation circuitry includes a first pulse generator circuit, a second pulse generator circuit, and a multiplexor. In one or more examples, the first pulse generator circuit is configured to generate a first pulsed output by sampling a data input using a first clock signal having first pulses and a second clock signal having second pulses that do not overlap the first pulses. The first clock signal and the second clock signal may be separated by a phase shift. The second pulse generator circuit can be configured to generate a second pulsed output by sampling the data input using a third clock signal having third pulses and a fourth clock signal having fourth pulses that do not overlap the third pulses. The third clock signal and the fourth clock signal can be separated by the phase shift. In various embodiments, the multiplexor is configured to output a third pulsed output based on the first pulsed output and the second pulsed output.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
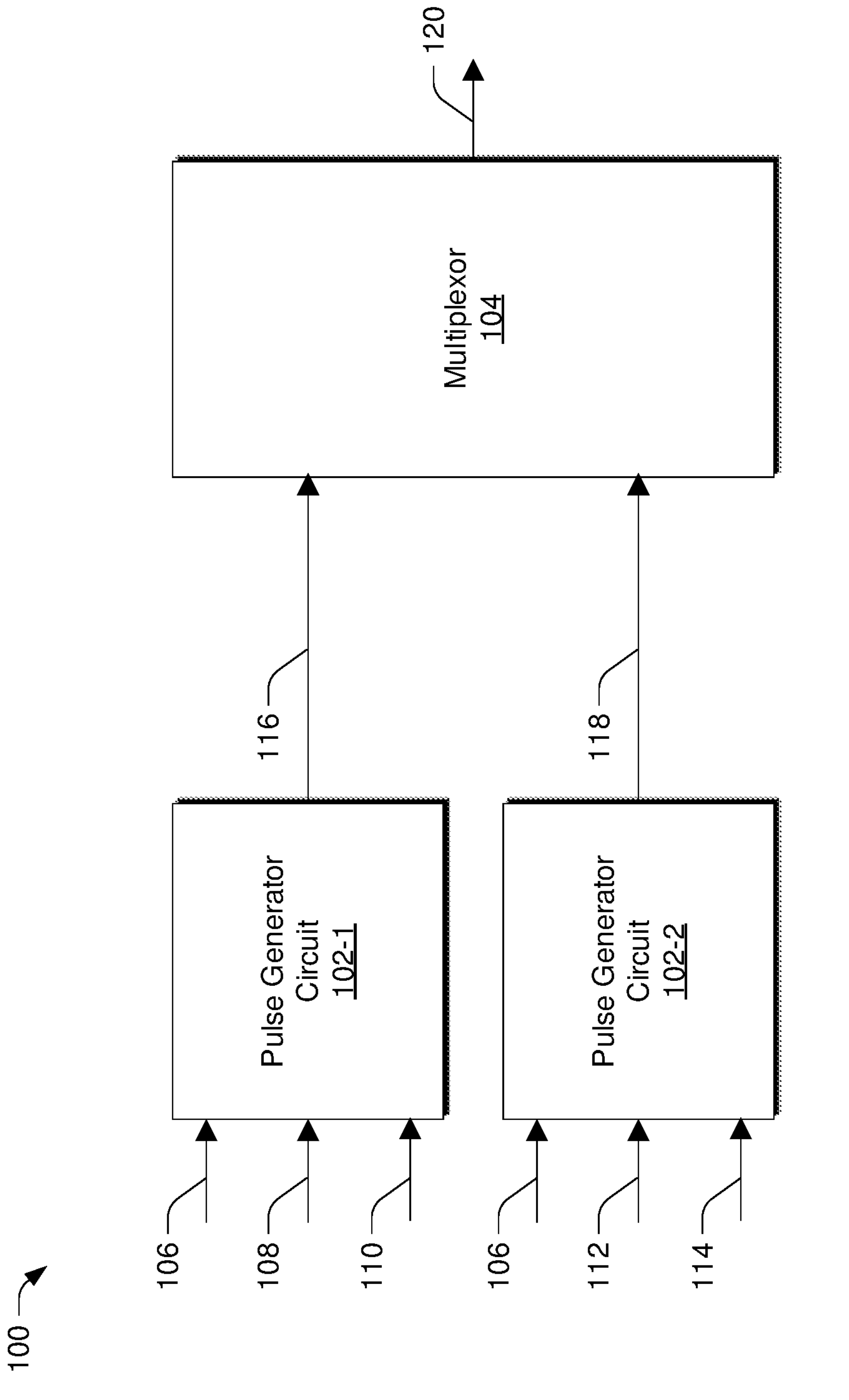
FIG. 1 illustrates pulse generation circuitry, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

In high-speed transmitter systems (e.g., 100+ Gbps), controlling transmitter components using an internal clock with a frequency that is lower than the frequency of the system clock (e.g., a quarter rate internal clock) reduces power consumption and improves signal integrity. However, quarter rate internal clocks have corresponding frequencies higher than 25 GHz for link transmission rates above 200 Gbps. At such high frequencies, clock integrity across Process, Voltage, Temperature (PVT) corners becomes questionable. Techniques to alleviate bandwidth requirements for quarter rate internal clocks involve adding passive inductors which is not desirable because passive inductors occupy a large area/footprint and introduce mutual coupling. Moreover, techniques to implement internal clocks which further reduce the frequency of the system clock are associated with heavy loads at output stages and reduced bandwidth.

Examples herein describe pulse generation circuitry including a first pulse generator circuit, a second pulse generator circuit, and a multiplexor. In various embodiments, the first pulse generator circuit generates a first pulsed output by sampling a data input using a first clock signal and a second clock signal which are separated by a phase shift (e.g., 45 degrees). In some examples, the first clock signal is shifted by 0 degrees relative to a system clock and the second clock signal is shifted by 45 degrees relative to the system clock. In one or more embodiments, the first clock signal includes pulses having a pulse width of one unit interval and the second clock signal includes pulses having a pulse width of three unit intervals. In various examples, the pulses of the first clock signal and the pulses of the second clock signal are consecutive without overlapping such that falling edges of the pulses included in the first clock signal correspond to rising edges of the pulses included in the second clock signal.

In some embodiments, the second pulse generator circuit generates a second pulsed output by sampling the data input using a third clock signal and a fourth clock signal which are also separated by the phase shift (e.g., 45 degrees). In one or more examples, the third clock signal is shifted by 180 degrees relative to the system clock and the fourth clock signal is shifted by 225 degrees relative to the system clock. In certain embodiments, the third clock signal includes pulses having a pulse width of one unit interval, the fourth clock signal includes pules having a pulse width of three unit intervals, and the pulses of the third and fourth clock signals are consecutive without overlapping. For example, falling edges of the pulses included in the third clock signal correspond to rising edges of the pulses included in the fourth clock signal.

In one or more embodiments, the multiplexor outputs a third pulsed output by combining the first pulsed output and the second pulsed output. Notably, the third pulsed output may have a frequency that is one eighth of the frequency of the system clock. For instance, the third pulsed output is usable as a one eighth rate internal clock for controlling transmitter components for systems with link transmission rates above 200 Gbps. Because the one eighth rate internal clock has a frequency which is half of a frequency of a quarter rate internal clock, the third pulsed output is capable of controlling the transmitter components with high integrity across PVT corners and without the footprint/coupling disadvantages associated with passive inductors.

FIG. 1 illustrates pulse generation circuitry 100, according to an example. The pulse generation circuitry 100 is illustrated to include a pulse generator circuit 102-1, a pulse generator circuit 102-2, and a multiplexor 104. In various embodiments, the pulse generator circuits 102-1, 102-2 receive a data input 106 which may describe multiple parallel data signals to be serialized for transmission by a transmitter of a wired (e.g., optical, electrical, etc.) communications system. In some embodiments, the data input 106 describes a data signal to be sampled for use as an internal clock having a frequency which is a fraction of a frequency of a system clock.

In one or more examples, the pulse generator circuit 102-1 is configured to sample the data input 106 using a first clock signal 108 and a second clock signal 110 separated by a phase shift (e.g., 45 degrees). In some examples, the data input 106 can describe multiple data inputs in parallel, and the pulse generator circuit 102-1 receives the multiple data inputs in parallel. For example, the first clock signal 108 may be shifted by 0 degrees relative to the system clock and the second clock signal 110 can be shifted by 45 degrees relative to the system clock. In various embodiments, the second clock signal 110 includes pulses having a pulse width that is greater than a pulse width of pulses included in the first clock signal 108. In some embodiments, the pulses of the first clock signal 108 have a pulse width of one unit interval and the pulses of the second clock signal 110 have a pulse width of three unit intervals.

In various examples, the pulses of the first clock signal 108 do not overlap the pulses of the second clock signal 112. In some examples, transitions from high states to low states of the pulses of the first clock signal 108 may correspond to transitions from low states to high states of the pulses of the second clock signal 110. For example, transitions from high states to low states of the pulses of the second clock signal 110 can correspond to transitions from low states to high states of the pulses of the first clock signal 108.

In certain embodiments, the pulse generator circuit 102-2 is configured to sample the data input 106 using a third clock signal 112 and a fourth clock signal 114 separated by the phase shift (e.g., 45 degrees). In various examples, the data input 106 may describe multiple data inputs in parallel, and the pulse generator circuit 102-2 receives the multiple data inputs in parallel. In one or more embodiments, the third clock signal 112 can be shifted by 180 degrees relative to the system clock, and the fourth clock signal may be shifted by 225 degrees relative to the system clock. In some examples, the fourth clock signal 114 includes pulses having a pulse width that is greater than a pulse width of pulses included in the third clock signal 112. In various examples, the pulses of the third clock signal 112 have a pulse width of one unit interval and the pulses of the fourth clock signal 114 have a pulse width of three unit intervals.

In some embodiments, the pulses of the third clock signal 112 do not overlap the pulses of the fourth clock signal 114. In one or more examples, transitions from high states to low states of the pulses of the third clock signal 112 can correspond to transitions from low states to high states of the pulses of the fourth clock signal 114. In various embodiments, transitions from high states to low states of the pulses of the fourth clock signal 114 may correspond to transitions from low states to high states of the pulses of the third clock signal 112.

In certain embodiments, the first clock signal 108 and the third clock signal 112 may be separated by an additional phase shift (e.g., 180 degrees). For example, if the first clock signal 108 is shifted by 0 degrees relative to the system clock and if the third clock signal 112 is shifted by 180 degrees relative to the system clock, then the first and third clock signals 108, 112 are separated by the additional phase shift of 180 degrees. Similarly, in some embodiments, the second clock signal 110 and the fourth clock signal 114 can be separated by the additional phase shift (e.g., 180 degrees). By way of example, if the second clock signal 110 is shifted by 45 degrees relative to the system clock and if the fourth clock signal 114 is shifted by 225 degrees relative to the system clock, then the second and fourth clock signals 110, 114 are separated by the additional phase shift of 180 degrees.

In one or more embodiments, the pulse generator circuit 102-1 samples the data input 106 using the pulses of the first clock signal 108 (e.g., having pulse widths of one unit interval) as set/data pulses and the pulses of the second clock signal 110 (e.g., having pulse widths of three unit intervals) as reset pulses. For example, the pulse generator circuit 102-1 outputs a first pulsed output 116 based on sampling the data input 106 using the first clock signal 108 and the second clock signal 110. In one or more examples, the first pulsed output 116 includes pulses having a pulse width of one unit interval.

In some embodiments, the pulse generator circuit 102-2 samples the data input 106 using the pulses of the third clock signal 112 (e.g., having pulse widths of one unit interval) as set/data pulses and the pulses of the fourth clock signal 114 (e.g., having pulse widths of three unit intervals) as reset pulses. In various examples, the pulse generator circuit 102-2 outputs a second pulsed output 118 based on sampling the data input 106 using the third clock signal 112 and the fourth clock signal 114. In some examples, the second pulsed output 118 includes pulses having a pulse width of one unit interval.

As shown in FIG. 1, the multiplexor 104 receives the first pulsed output 116 from the pulse generator circuit 102-1 and receives the second pulsed output 118 from the pulse generator circuit 102-2. In various embodiments, the multiplexor 104 can include two-to-one combiner circuitry which combines the first pulsed output 116 and the second pulsed output 118 into a third pulsed output 120. In one or more examples, the third pulsed output 120 includes pulses having a pulse width of one unit interval. In some embodiments, the third pulsed output 120 has a frequency that is one eighth of the frequency of the system clock (e.g., the third pulsed output 120 is a one eighth rate pulsed output). In examples in which the data input 106 describes the multiple data inputs in parallel, the multiplexor 104 is configured to serialize the multiple data inputs for transmission by the transmitter of the wired communications system.

Notably, by sampling the data input 106 using the pulse generator circuit 102-1 to output the first pulsed output 116 and by sampling the data input 106 using the pulse generator circuit 102-2 to output the second pulsed output 118, the first and second pulsed outputs 116, 118 can be combined into the third pulsed output 120 having the one eighth rate without the heavy load and reduced output bandwidth associated with sampling the data input 106 into a one eighth rate pulsed output in one stage. This improvement, for example, facilitates implementation of one eighth rate internal clocks for high-speed transmitter applications (e.g., 100+ Gbps). For instance, a quarter rate internal clock for transmitting over a 224 Gbps link has a frequency of 28 GHz. At such high frequency, clock integrity of the quarter rate internal clock across different Process, Voltage, Temperature (PVT) corners becomes questionable. Although it may be possible to alleviate the bandwidth requirements with the addition of passive inductors and using techniques such as inductive peaking and narrowband tuned clock buffer design, the passive inductors occupy a large area/footprint and also introduce mutual coupling.

For example, areas occupied by a quarter rate architecture and a one eighth rate architecture are 1800 $\mu m^2$ and 400 $\mu m^2$, respectively. Thus, the pulse generation circuitry 100 has a substantially reduced footprint compared to the quarter rate architecture. The one eighth rate architecture also demonstrates greater PVT corner performance/stability than the quarter rate architecture. For instance, the random jitter of the one eighth rate architecture remains under 30 femtoseconds across PVT corners whereas the random jitter of quarter rate architecture exceeds 100 femtoseconds at the slow-slow corner. In various embodiments, the pulse generation circuitry 100 can be implemented to combine the first pulsed output 116 and the second pulsed output 118 prior to the driver stage to prevent bandwidth degradation at the pre-driver's summing node.

Figure 2:
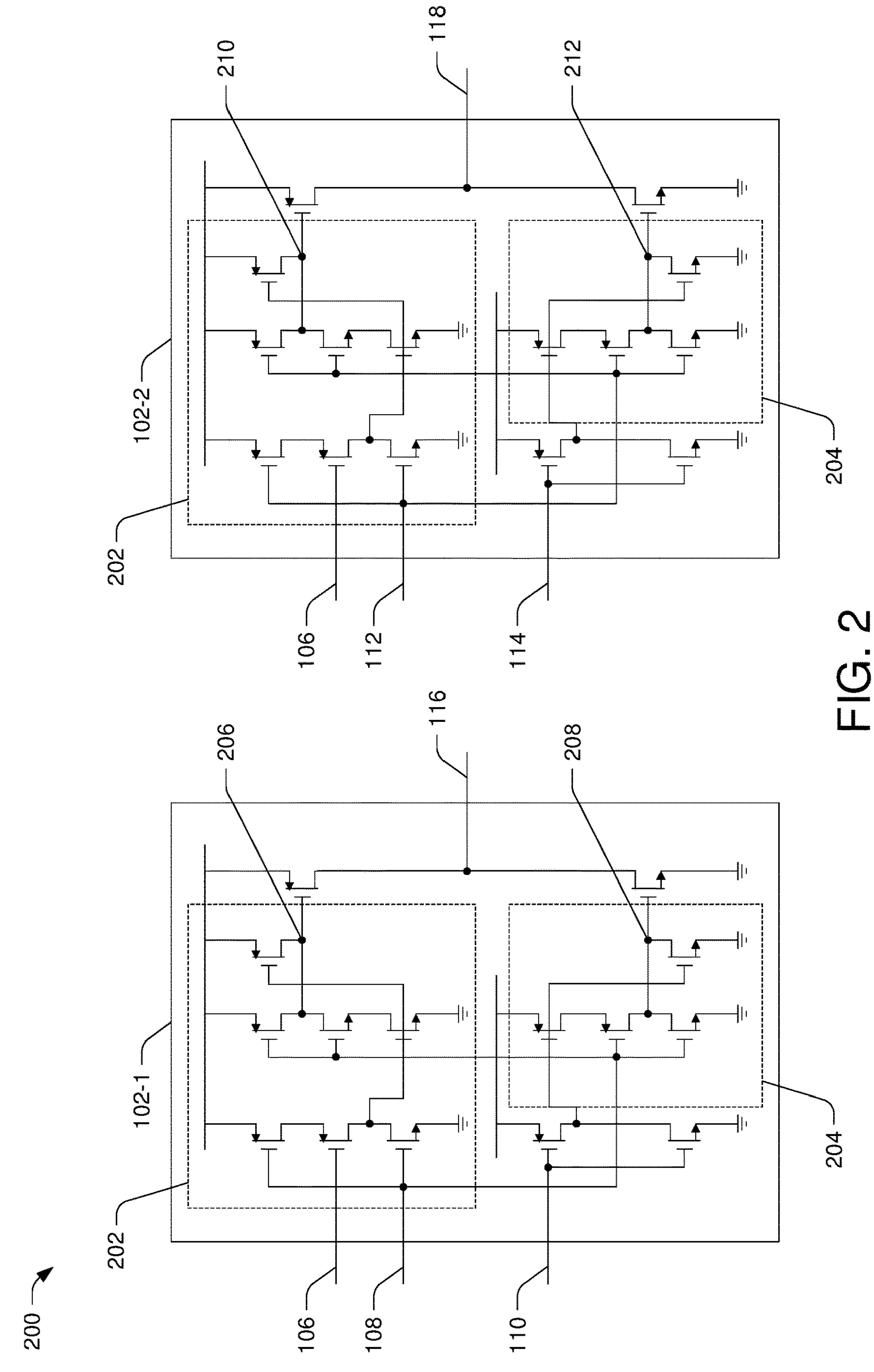
FIG. 2 is a diagram illustrating a first pulse generator circuit and a second pulse generator circuit, according to an example.

FIG. 2 is a diagram 200 illustrating a first pulse generator circuit and a second pulse generator circuit, according to an example. As shown in FIG. 2, the diagram 200 depicts details of example implementations of the pulse generator circuit 102-1 and the pulse generator circuit 102-2. The pulse generator circuits 102-1, 102-2 are illustrated as including NMOS, PMOS, and CMOS circuitry; however, it is to be appreciated that the pulse generator circuits 102-1, 102-2 can be implemented using alternative or additional circuitry.

In various embodiments, the pulse generator circuits 102-1, 102-2 include one unit interval set/data pulse circuitry 202 and three unit interval reset pulse circuitry 204. In one or more embodiments, in order to generate the first pulsed output 116, the pulse generator circuit 102-1 combines a first internal signal 206 and a second internal signal 208. In some examples, the first internal signal 206 is output from the one unit interval set/data pulse circuitry 202 based on the first clock signal 108. In various examples, the second internal signal 208 is output from the three unit interval reset pulse circuitry 204 based on the second clock signal 110.

In certain embodiments, in order to generate the second pulsed output 118, the pulse generator circuit 102-2 combines a third internal signal 210 and a fourth internal signal 212. For example, the third internal signal 210 is output from the one unit interval set/data pulse circuitry 202 based on the third clock cycle 112. In one or more examples, the fourth internal signal 212 is output from the three unit interval reset pulse circuitry 204 based on the fourth clock signal 114.

Figure 3:
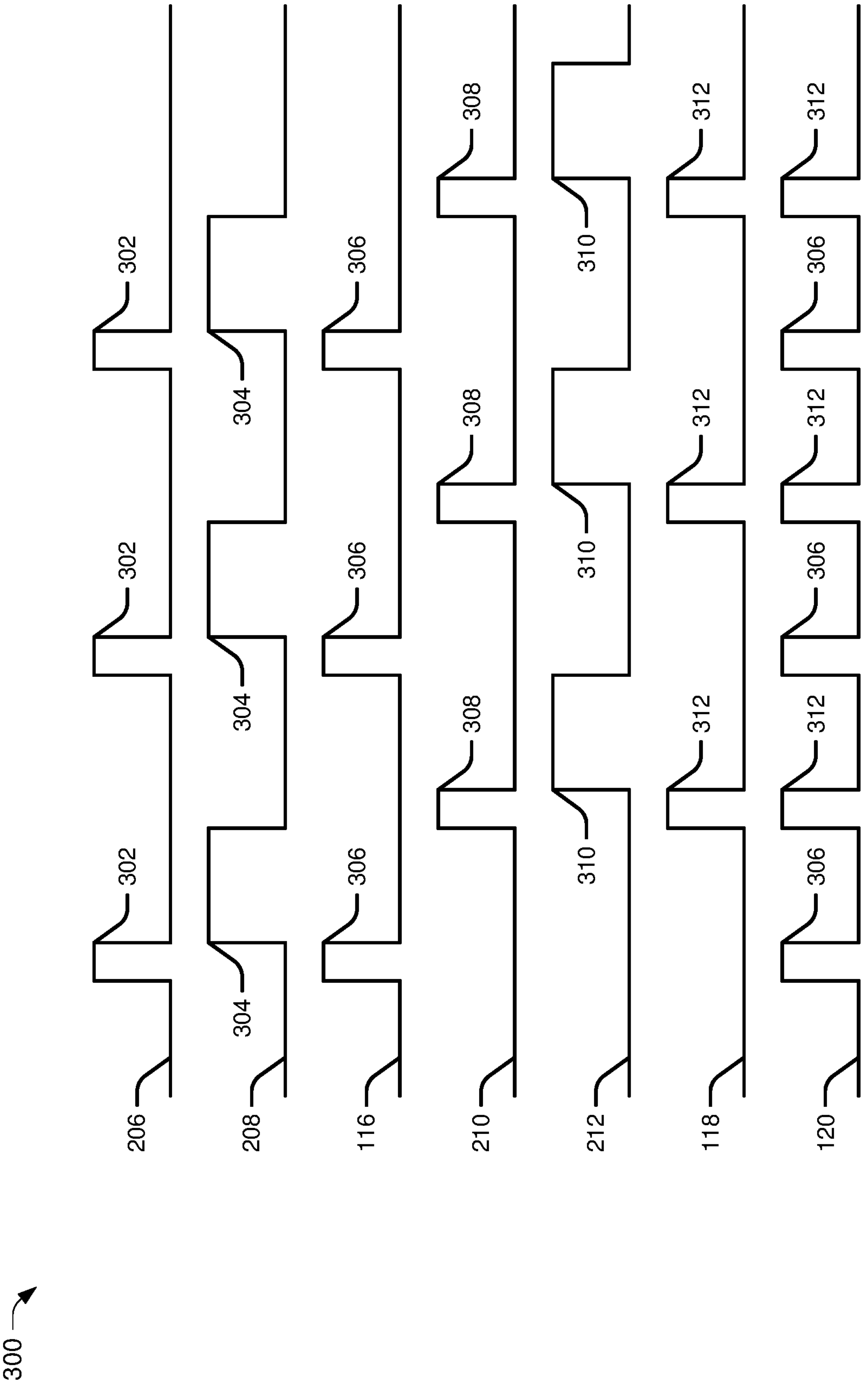
FIG. 3 illustrates a representation of generation of a pulsed output, according to an example.

FIG. 3 illustrates a representation 300 of generation of a pulsed output, according to an example. The representation 300 illustrates the first internal signal 206 and the second internal signal 208. As shown, the first internal signal 206 is shifted by 0 degrees relative to the system clock and includes pulses 302 having a pulse width of one unit interval. In some examples, the second internal signal 208 is shifted by 45 degrees relative to the system clock and includes pulses 304 having a pulse width of three unit intervals.

In various embodiments, the pulses 302 are set/data pulses and the pulses 304 are reset pulses. In certain embodiments, the pulses 302 and the pulses 304 do not overlap. For example, transitions from high states to low states of the pulses 302 correspond to transitions from low states to high states of the pulses 304. In some examples, as described above, the pulse generator circuit 102-1 combines the first internal signal 206 and the second internal signal 208 in order to generate the first pulsed output 116. As shown in FIG. 3, the first pulsed output 116 includes pulses 306 which have a pulse width of one unit interval.

The representation 300 also illustrates the third internal signal 210 and the fourth internal signal 212. For example, the third internal signal 210 is shifted by 180 degrees relative to the system clock and includes pulses 308 having a pulse width of one unit interval. In one or more examples, the fourth internal signal 212 is shifted by 225 degrees relative to the system clock and includes pulses 310 having a pulse width of three unit intervals.

In some embodiments, the pulses 308 are set/data pulses and the pulses 310 are reset pulses. In various embodiments, the pulses 308 and the pulses 310 do not overlap. In certain embodiments, transitions from high states to low states of the pulses 308 correspond to transitions from low states to high states of the pulses 310. In some examples, as described above, the pulse generator circuit 102-2 combines the third internal signal 210 and the fourth internal signal 212 in order to generate the second pulsed output 118. For example, the second pulsed output 118 includes pulses 312 which have a pulse width of one unit interval.

As shown, the representation 300 depicts the third pulsed output 120. In one or more embodiments, the multiplexor 104 receives and combines the first pulsed output 116 and the second pulsed output 118 in order to output the third pulsed output 120. In various examples, the third pulsed output 120 includes the pulses 306 and the pulses 312. In certain examples, the pulses 306 and the pulses 312 both have pulse widths of one unit interval. In some embodiments, the third pulsed output 120 has a frequency which is one eighth the frequency of the system clock. For instance, the third pulsed output 120 can be used as an internal clock for transmitter circuitry in high-speed transmitter applications (e.g., 100+ Gbps).

Figure 4:
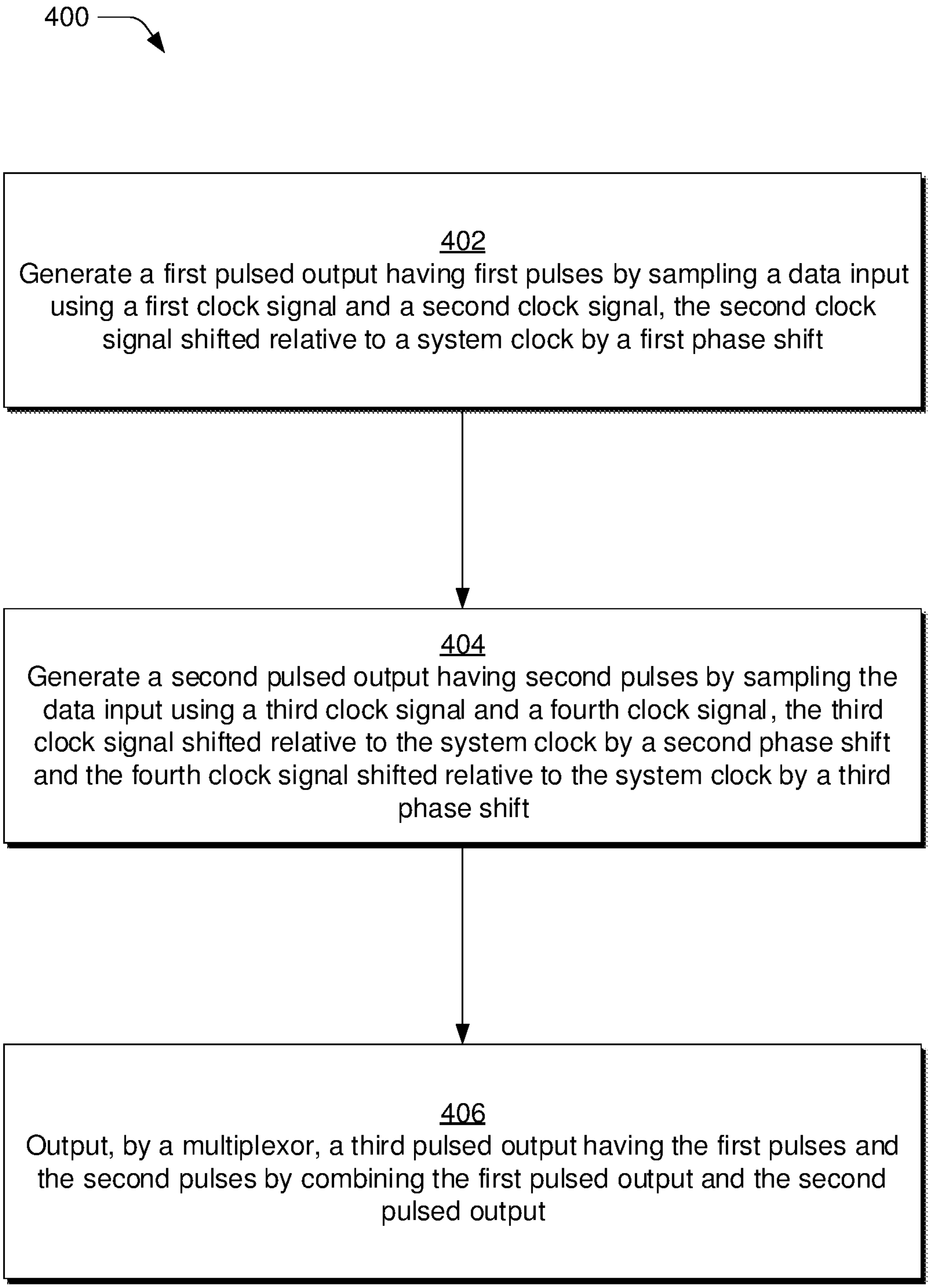
FIG. 4 is a flow diagram depicting a method for outputting a third pulsed output by combining a first pulsed output and a second pulsed output, according to an example.

FIG. 4 is a flow diagram depicting a method 400 for outputting a third pulsed output by combining a first pulsed output and a second pulsed output, according to an example. At 402, a first pulsed output is generated having first pulses by sampling a data input using a first clock signal and a second clock signal, the second clock signal shifted relative to a system clock by a first phase shift. In one or more embodiments, the pulse generator circuit 102-1 generates the first pulsed output 116 by sampling the data input 106 using the first clock signal 108 and the second clock signal 110. For example, the first clock signal 108 is shifted by 0 degrees relative to a system clock and the second clock signal 110 is shifted by a first phase shift of 45 degrees relative to the system clock.

At 404, a second pulsed output is generated having second pulses by sampling the data input using a third clock signal and a fourth clock signal, the third clock signal shifted relative to the system clock by a second phase shift and the fourth clock signal shifted relative to the system clock by a third phase shift. In various embodiments, the pulse generator circuit 102-2 generates the second pulsed output 118 by sampling the data input 106 using the third clock signal 112 and the fourth clock signal 114. In some examples, the third clock signal 112 is shifted by a second phase shift of 180 degrees relative to the system clock, and the fourth clock signal is shifted by a third phase shift of 225 degrees relative to the system clock.

At 406, a third pulsed output having the first pulses and the second pulses is output, by a multiplexor, by combining the first pulsed output and the second pulsed output. In various embodiments, the third pulsed output 120 is output by the multiplexor 104 based on the first pulsed output 116 and the second pulsed output 118. In one or more examples, the multiplexor 104 combines the first pulsed output 116 and the second pulsed output 118 as the third pulsed output 120.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

While the foregoing is directed to specific examples, other and further examples may be devised without departing from the basic scope thereof, and the scope thereof is determined by the claims that follow.

What is claimed is:

1. Pulse generation circuitry comprising:

a first pulse generator circuit configured to generate a first pulsed output by sampling a data input using a first clock signal having first pulses and a second clock signal having second pulses that do not overlap the first pulses, the first clock signal and the second clock signal separated by a phase shift, wherein the first pulses and the second pulses comprise electrical pulses and the first pulse generator circuit generates the first pulsed output in response to transitions of the electrical pulses;

a second pulse generator circuit configured to generate a second pulsed output by sampling the data input using a third clock signal having third pulses and a fourth clock signal having fourth pulses that do not overlap the third pulses, the third clock signal and the fourth clock signal separated by the phase shift, wherein the third pulses and the fourth pulses comprise electrical pulses and the second pulse generator circuit generates the second pulsed output in response to transitions of the electrical pulses; and a multiplexor configured to output a third pulsed output based on the first pulsed output and the second pulsed output.

2. The pulse generation circuitry of claim 1, wherein the first clock signal and the third clock signal are separated by an additional phase shift.

3. The pulse generation circuitry of claim 2, wherein the second clock signal and the fourth clock signal are separated by the additional phase shift.

4. The pulse generation circuitry of claim 2, wherein the additional phase shift is a 180 degree phase shift.

5. The pulse generation circuitry of claim 1, wherein the phase shift is a 45 degree phase shift.

6. The pulse generation circuitry of claim 1, wherein the first pulses and the third pulses have a pulse width of one unit interval.

7. The pulse generation circuitry of claim 6, wherein the second pulses and the fourth pulses have a pulse width of three unit intervals.

8. The pulse generation circuitry of claim 6, wherein transitions from high states to low states of pulses of the first clock signal correspond to transitions from low states to high states of pulses of the second clock signal.

9. The pulse generation circuitry of claim 1, wherein the third pulsed output is a one eighth rate pulsed output.

10. Transmitter circuitry comprising:

a first circuit configured to sample multiple data inputs based on a first clock signal having first pulses of a first width and a second clock signal having second pulses of a second width, the multiple data inputs received by the first circuit in parallel;

a second circuit configured to sample the multiple data inputs based on a third clock signal having third pulses of the first width and a fourth clock signal having fourth pulses of the second width, the multiple data inputs received by the second circuit in parallel; and a multiplexor configured to serialize the multiple data inputs based on an output from the first circuit and an output from the second circuit.

11. The transmitter circuitry of claim 10, wherein the first clock signal and the second clock signal are separated by a phase shift of 45 degrees.

12. The transmitter circuitry of claim 11, wherein the third clock signal and the fourth clock signal are separated by the phase shift of 45 degrees.

13. The transmitter circuitry of claim 10, wherein the first clock signal and the third clock signal are separated by a phase shift of 180 degrees.

14. The transmitter circuitry of claim 13, wherein the second clock signal and the fourth clock signal are separated by the phase shift of 180 degrees.

15. The transmitter circuitry of claim 10, wherein the first width is one unit interval and the second width is three unit intervals.

16. A method comprising:

generating a first pulsed output having first pulses by sampling a data input using a first clock signal and a second clock signal, the second clock signal shifted relative to a system clock by a first phase shift, wherein the first pulses comprise electrical pulses and the first pulsed output is generated in response to transitions of the electrical pulses;

generating a second pulsed output having second pulses by sampling the data input using a third clock signal and a fourth clock signal, the third clock signal shifted relative to the system clock by a second phase shift and the fourth clock signal shifted relative to the system clock by a third phase shift, wherein the second pulses comprise electrical pulses and the second pulsed output is generated in response to transitions of the electrical pulses; and outputting, by a multiplexor, a third pulsed output having the first pulses and the second pulses by combining the first pulsed output and the second pulsed output.

17. The method of claim 16, wherein the first clock signal includes first pulses having a width of one unit interval and the second clock signal includes second pulses having a width of three unit intervals.

18. The method of claim 17, wherein the first pulses and the second pulses do not overlap.

19. The method of claim 16, wherein the third pulsed output is a one eighth rate pulsed output.

20. The method of claim 16, wherein the first phase shift is 45 degrees, the second phase shift is 180 degrees, and the third phase shift is 225 degrees.

* * * * *